(12) United States Patent
Lee

(10) Patent No.: US 8,674,601 B2
(45) Date of Patent: Mar. 18, 2014

(54) FLAT PANEL DISPLAY APPARATUS HAVING SEALING MEMBER PARTIALLY OVERLAPPING OUTERMOST PIXELS AND METHOD OF MANUFACTURING THE SAME

(75) Inventor: Jeong-Yeol Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 215 days.

(21) Appl. No.: 13/137,115

(22) Filed: Jul. 21, 2011

(65) Prior Publication Data

US 2012/0043880 A1    Feb. 23, 2012

(30) Foreign Application Priority Data

Aug. 20, 2010 (KR) .................. 10-2010-0080882

(51) Int. Cl.
*H01L 51/52* (2006.01)
*H01L 51/56* (2006.01)

(52) U.S. Cl.
USPC ............................................ 313/512; 445/25

(58) Field of Classification Search
USPC .............. 257/100; 313/512; 349/153; 445/25
See application file for complete search history.

(56) References Cited

U.S. PATENT DOCUMENTS

2005/0189878 A1* 9/2005 Shitagami et al. ............ 313/512
2007/0176554 A1* 8/2007 Kwak ........................... 313/512
2009/0115933 A1* 5/2009 Mimura ......................... 349/59

FOREIGN PATENT DOCUMENTS

| KR | 10-2002-0054217 A | 7/2002 |
| KR | 10-2003-0088645 A | 11/2003 |
| KR | 10-2005-0050281 A | 5/2005 |
| KR | 10-2005-0057760 A | 6/2005 |
| KR | 10 2006-0088682 A | 8/2006 |

* cited by examiner

*Primary Examiner* — Nimeshkumar Patel
*Assistant Examiner* — Steven Horikoshi
(74) *Attorney, Agent, or Firm* — Lee & Morse, P.C.

(57) ABSTRACT

A flat panel display apparatus includes: a first substrate, a second substrate opposite the first substrate and including a display region in which a plurality of pixels are formed, and a sealing member between the first substrate and the second substrate; the sealing member bonds the first substrate and the second substrate to each other. The sealing member overlaps at least a part of outermost pixels of the display region.

18 Claims, 4 Drawing Sheets

FLAT PANEL DISPLAY APPARATUS HAVING SEALING MEMBER PARTIALLY OVERLAPPING OUTERMOST PIXELS AND METHOD OF MANUFACTURING THE SAME

BACKGROUND

1. Field

Embodiments relate to flat panel display apparatuses and methods of manufacturing the flat panel display apparatuses.

2. Description of the Related Art

Normal display apparatuses are being replaced with portable, thin flat panel display apparatuses. Flat panel display apparatuses may be realized as various types, e.g. liquid crystal display apparatuses, organic light emitting display apparatuses, plasma display panel apparatuses, etc. Flat display panels include substrates, encapsulation substrates, liquid crystal layers disposed between the substrates and the encapsulation substrates, or organic light emitting diodes (OLED), etc. Flat panel displays may have pixel circuits formed on the substrates.

In a conventional flat display apparatus, if moisture or oxygen permeates into flat panel display panels from a surrounding environment, a lifespan of flat panel display apparatuses, including the flat panel display panels, is reduced due to oxidation of electrode materials, disbanding thereof, etc. Light emission efficiency and light color purity are deteriorated due to liquid crystal material and organic material deterioration.

A sealing process is typically performed to separate an inner portion of flat display panels from a surrounding environment. The sealing process is also performed to prevent moisture from permeating into the flat display panels.

SUMMARY

One or more embodiments provide a flat panel display apparatuses with improved visibility using a sealing method.

One or more embodiments provide a method of manufacturing flat panel display apparatuses with reinforced mechanical rigidity by increasing a sealing effect of cell seals of flat panel display apparatuses.

At least one of the above and other features and advantages may be realized by providing a flat panel display apparatus including: a first substrate; a second substrate opposite the first substrate, the second substrate including a display region in which a plurality of pixels are formed; and a sealing member between the first substrate and the second substrate and for bonding the first substrate and the second substrate to each other, wherein the sealing member overlaps at least a part of outermost pixels of the display region.

The second substrate may include at least one driving unit for supplying a plurality of driving signals to the plurality of pixels, wherein the sealing member overlaps at least one driving unit.

The sealing member may include: a first sealing member formed on the first substrate and overlapping with the at least a part of outermost pixels of the display region; and a second sealing member disposed between the first substrate and the second substrate and formed on outer sides of the at least one driving unit.

The plurality of pixels may include organic light emitting diodes (OLEDs).

The sealing member may overlap at least a part of a light emitting layer of the OLEDs of outermost pixels of the display region.

An area where the sealing member and the outermost pixels of the display region overlap may be determined such that visibility of the outermost pixels of the display region is the same as that of inner pixels of the display region.

The sealing member may surround outer sides of the display region.

The sealing member may be a frit.

At least one of the above and other features and advantages may also be realized by providing a method of manufacturing a flat panel display apparatus including a first substrate, a second substrate opposite the first substrate, and a display region in which a plurality of pixels are formed, the method including: forming a sealing member on the first substrate to overlap at least a part of outermost pixels of the display region; disposing the first substrate on the second substrate; and bonding the first substrate to the second substrate by using the sealing member.

The second substrate may include at least one driving unit for supplying a plurality of driving signals to the plurality of pixels, wherein forming the sealing member comprises overlapping the sealing member with the at least one driving unit.

The forming of the sealing member may include: forming a first sealing member on the first substrate to overlap with the at least a part of outermost pixels of the display region; and forming a second sealing member on the first sealing member and disposed on outer sides of the at least one driving unit.

The bonding of the first substrate to the second substrate may include: melting and hardening the sealing member by irradiating a laser beam or infrared light onto at least a part of outer sides of the at least one driving unit.

The plurality of pixels may include OLEDs.

The forming of the sealing member may include: overlapping the sealing member with at least a part of a light emitting layer of the OLEDs of the outermost pixels of the display region.

An area where the sealing member and the outermost pixels of the display region overlap may be determined such that visibility of the outermost pixels of the display region is the same as that of inner pixels of the display region.

The forming of the sealing member may include: forming the sealing member to surround outer sides of the display region.

The bonding of the first substrate to the second substrate may include: melting and hardening the sealing member by irradiating a laser beam or infrared light onto at least a region of the sealing member.

The sealing member may be a frit.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0080882, filed on Aug. 20, 2010, in the Korean Intellectual Property Office, and entitled: "Flat Panel Display Apparatus and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the inventive concept to those skilled in the art.

Figure 1:
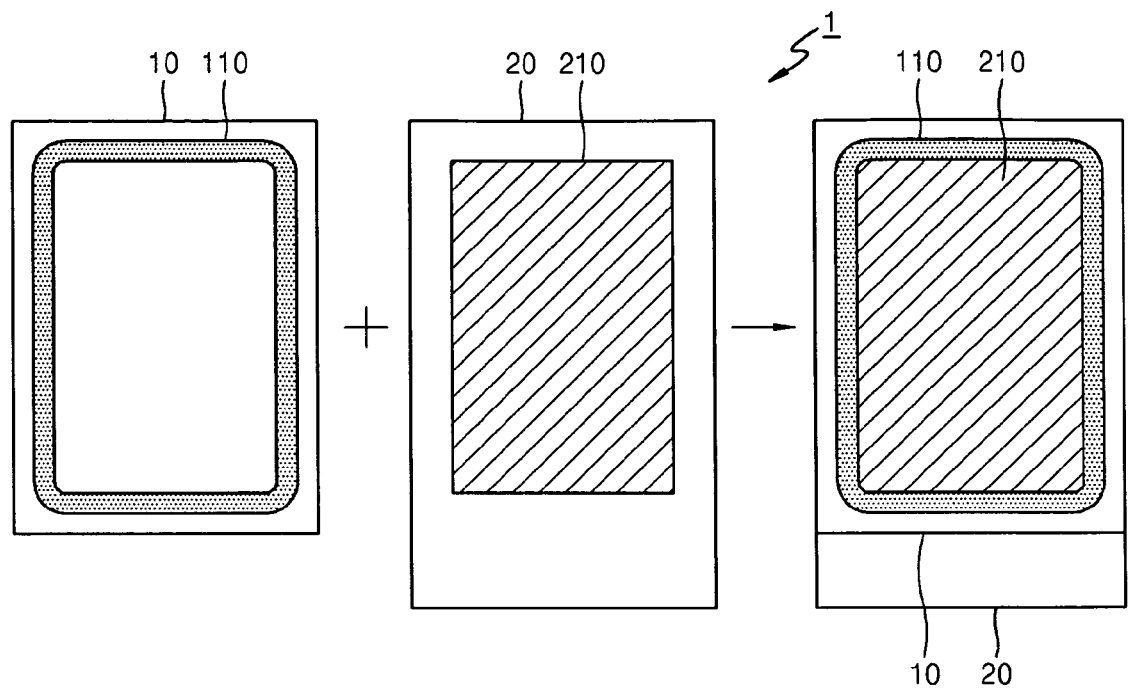
FIG. 1 illustrates a schematic view of a flat panel display apparatus according to an embodiment.

FIG. 1 is a schematic view of a flat panel display apparatus according to an embodiment.

Referring to FIG. 1, the flat panel display apparatus 1 of the present embodiment includes a first substrate 10 and a second substrate 20. The first substrate 10 is an encapsulation substrate. The second substrate 20 may be a substrate on which a plurality of pixels and a plurality of driving units may be disposed. The first substrate 10 and the second substrate 20 may be bonded to each other by using a sealing member 110. The second substrate 20 includes a display region 210 in which the pixels are formed. The display region 210 may have an image formed and displayed by the pixels.

The second substrate 20 may be formed of a transparent glass material having $SiO_2$ as a main component. However, the second substrate 20 is not limited thereto. The second substrate may be formed of other transparent plastic materials, instead. The plastic material of the second substrate 20 may include polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

The sealing member 110 is coated on the first substrate 10. The first substrate 10 is disposed on the second substrate 20. The sealing member 110 is melted so that the first substrate 10 and the second substrate 20 are adhered to each other.

The sealing member 110 surrounds the display region 210. The sealing member 110 may include, for example, a frit or an epoxy sealant. Although the frit is a powder type glass material, including an additive, the frit may refer to glass formed by fusing the frit in a field of glass. Thus, the frit used in the specification may include both embodiments defined above. The frit is used to entirely seal the first substrate 10 and the second substrate 20 together. The frit effectively prevents oxygen and moisture from permeating therebetween. The frit is formed of a transition metal material and is black to prevent light from passing through the frit. Thus, the frit may act as a black matrix (BM).

Conventionally, the frit formed on outermost edges of the first substrate 10 and the second substrate 20. In addition, the frit formed does not prevent light from a light source from passing through a non-display area. Conventionally, the frit is formed on an outermost edge of a sealing region and is only used as a sealing member for adhering two substrates.

According to the present embodiment, the frit overlaps a part of the display region 210. In addition, the frit is coated on a part of the display region 210. Thus, the frit is used as the sealing member 110 and as a BM. Therefore, the frit prevents light from the light source from passing therethrough.

The sealing member 110, coated on the first substrate 10, is disposed to cover at least a part of the display region 210 of the second substrate 20. The sealing member 110 may be disposed to cover at least a part of outermost sub-pixels formed in the display region 210. The sealing member 110 disposition will now be described in detail. The plurality of pixels are formed on the display region 210. The pixels may have various shapes. In the present embodiment, the pixels include organic light emitting diodes (OLEDs). However, the pixels are not limited thereto. The pixels may also include various types of display devices, such as liquid crystal devices, electrophoresis devices, etc.

Figure 2:
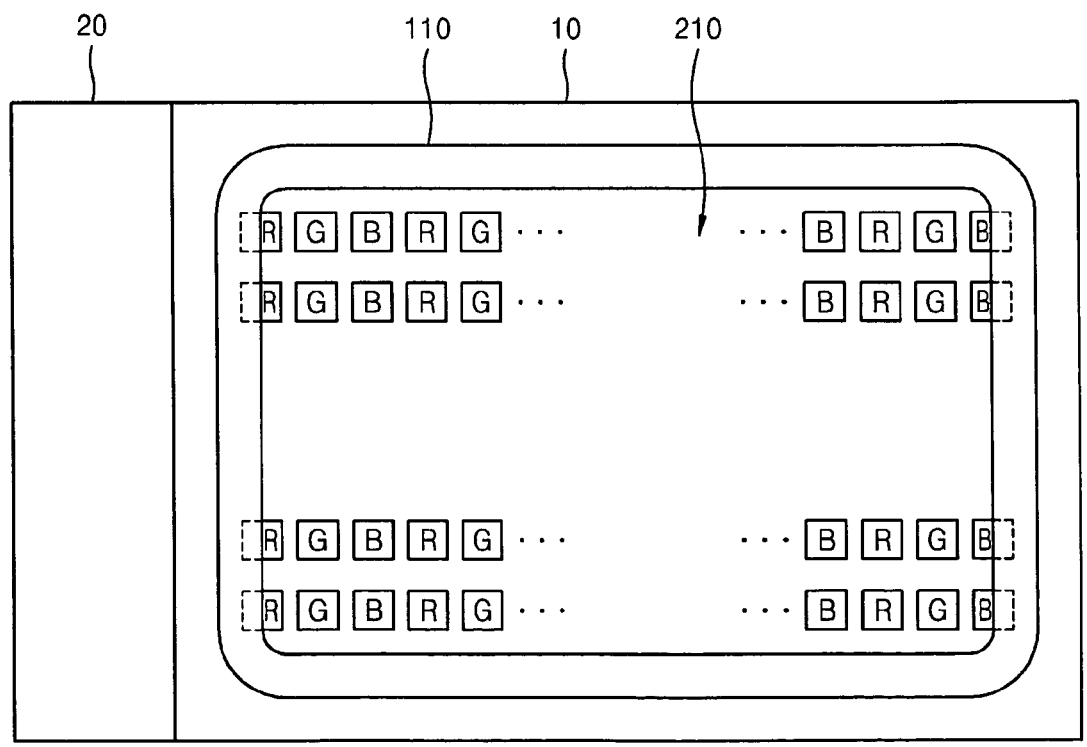
FIG. 2 illustrates a schematic view of a sealing member and a plurality of sub-pixels according to an embodiment.

FIG. 2 is a schematic view illustrating the sealing member 110 and pluralities of sub-pixels R, G, and B according to an embodiment. Referring to FIG. 2, R denotes red sub-pixels, G denotes green sub-pixels, and B denotes blue sub-pixels.

The sealing member 110 is disposed to partially cover the outermost sub-pixels. The outermost sub-pixels are among the pixels formed on the second substrate 20. The sealing member 110 is disposed to partially cover the red sub-pixels R. The red-sub pixels R are formed on a left outer side of the second substrate 20. The sealing member 110 is disposed to partially cover the blue sub-pixels B. The blue sub-pixels are formed on a right outer side of the second substrate 20. However, the present embodiments are not limited to the arrangement of the red sub-pixels R, the green sub-pixels G, and the blue sub-pixels B shown in FIG. 2. The arrangement thereof will vary, according to the present embodiments.

The pixels are formed on the second substrate 20. With regard to the display region 210, there are sub-pixels neighboring inner sides of the outermost sub-pixels. However, there are no sub-pixels neighboring outer sides of the outermost sub-pixels. Thus, visibility of outermost sub-pixels of the display region 210 is greater than that of the inner sub-pixels. When the red sub-pixels R or the blue sub-pixels B are arranged as the outermost sub-pixels of the display region 210, as shown in FIG. 2, visibility of the red sub-pixels R or the blue sub-pixels B is greater than pixels other than the outermost sub-pixels.

If visibility of specific color sub-pixels is greater than sub-pixels of another color in a corresponding pixel, a color expressed is not correctly visible in the corresponding pixel. To reduce the visibility of the outermost sub-pixels, the visibility of the outermost sub-pixels is equalized with the visibility of the inner sub-pixels by partially covering the outermost sub-pixels with the sealing member 110. Therefore, the present embodiment provides a solution when an expressed color is not correctly visible by the outermost sub-pixels.

The sealing member 110 and the outermost sub-pixels overlap may be adjusted so that the outermost sub-pixels and the inside sub-pixels are visible in the same, or in a similar manner.

The sealing member 110, such as a frit, may act as a BM. The sealing member 110 may be disposed to cover the outermost sub-pixels of the display region 210. Thus, the sealing member 110 may act as a BM. Therefore, the process of forming a BM may be skipped. Accordingly, the manufacturing cost of the flat panel display apparatus 1 is reduced.

Figure 3:
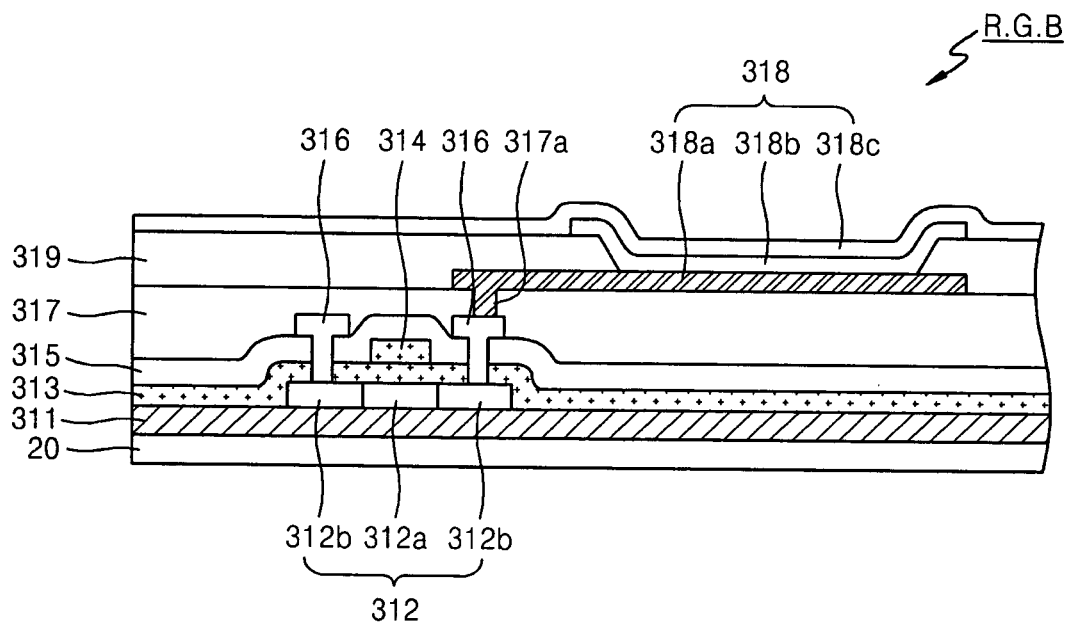
FIG. 3 illustrates a cross-sectional view of sub-pixels according to an embodiment.

FIG. 3 is a cross-sectional view of the sub-pixels R, G, and B according to an embodiment.

Referring to FIG. 3, each of the sub-pixels R, G, and B includes an OLED 318. Thus, a self light emitting element, and one or more thin film transistors are connected to the OLED 318. A structure of each of the sub-pixels R, G, and B may be modified in an active matrix flat panel display device or a passive matrix flat panel display device. Each of the thin film transistors includes a buffer layer 311 formed on the second substrate 20, a semiconductor layer 312, a gate insulation film 313 formed on the semiconductor layer 312, a gate electrode 314 formed on the gate insulation film 313, an interlayer insulation film 315 formed on the gate electrode 314, and source and drain electrodes 316 formed on the interlayer insulation film 315. The source and drain electrodes 316 are connected to the source and drain regions 312b. The semiconductor layer 312 is formed on the buffer layer 311 and includes a channel region 312a and source and drain regions 312b.

The semiconductor layer 312 may be formed of an inorganic semiconductor, e.g. amorphous silicon, polysilicon, or an organic semiconductor. The source and drain regions 312b may be formed by doping the semiconductor layer 312. The semiconductor layer 312 is formed of amorphous silicon or polysilicon with impurities. If the semiconductor layer 312 is doped with a 3rd group element, e.g. boron (B), the source and drain regions 312b may be formed as p-type semiconductors. If the semiconductor layer 312 is doped with a 5th group element, e.g. nitrogen (N), the source and drain region 312b may be formed as n-type semiconductors.

The gate insulation film 313 is used to insulate the semiconductor layer 312 and the gate electrode 314 from each other. The gate insulation film 313 may be formed of an organic material or an inorganic material, e.g., SiNx or $SiO_2$.

The gate electrode 314 may be formed of a metal, e.g., Au, Ag, Cu, Ni, Pt, Pd, Al, or Mo, or a metal alloy. The metal alloy may be an Al:Nd alloy or an Mo:W alloy. However, the gate electrode 314 is not limited thereto. The gate electrode may also be formed of any of various materials in consideration of adhesion, planarization, electrical resistance, workability, etc. The gate electrode 314 is connected to a gate line (not shown) that applies an electrical signal.

The source and drain electrodes 316 may be formed of a metal, such as Au, Pd, Pt, Ni, Rh, Ru, Ir, Al, Mo, or Os, or an alloy including two or more types of metals. The alloy may be an Al:Nd alloy or Mo:W alloy, but is not limited thereto.

A planarization film 317 is formed on each of the thin film transistors. The planarization file 317 includes a via hole 317a, through which at least a region of the source and drain electrodes 316 is exposed. The planarization film 317 may use an inorganic insulation film and/or an organic insulation film. The inorganic insulation film may include, e.g. $SiO_2$, SiNx, SiON, $Al_2O_3$, $TiO_2$, $Ta_2O_5$, $HfO_2$, $ZrO_2$, BST, or PZT. The organic insulation film may include, e.g. general-purpose polymer polystyrene (PS), polymethylmethacrylate (PMMA), and a polymer derivative. The polymer derivate may include a phenol group, an acrylic polymer, an imidic polymer, an aryletheric polymer, an amidic polymer, a fluoric polymer, a p-xylenic polymer, a vinyl alcoholic polymer, or blends thereof. The planarization film 317 may be formed as a composite of the inorganic insulation film and the organic insulation film.

The OLED 318 is formed on the planarization film 317. The OLED 318 is connected to the thin film transistors through the via hole 317a.

The OLED 318 includes a first electrode 318a, a second electrode 318c, and an organic light emitting layer 318b disposed therebetween. The first electrode 318a is formed on the planarization film 317 and is connected to the source and drain electrodes 316 of the thin film transistors through the via hole 317a. The first electrode 318a may include a reflection film (not shown) in the sub-pixels R, G, and B. The reflection film reflects light toward a front surface. A pixel definition film 319 is formed on the first electrode 318a. The pixel definition film 319 includes an aperture through which at least a part of the first electrode 318a is exposed. The organic light emitting layer 318b is formed in the aperture of the pixel definition film 319. Thus, a passivation layer (not shown) may be formed on the second electrode 318c. The organic light emitting layer 318b generates light with a predetermined brightness in response to current supplied from the thin film transistors.

The first electrode 318a and the second electrode 318c are an anode electrode and a cathode electrode, respectively. The first electrode 318a and the second electrode 318c may also be the cathode electrode and the anode electrode, respectively. The organic light emitting layer 318b may be formed of different types of materials, according to color components of the sup-pixels R, G, and B.

When the first substrate 10 and the second substrate 20 are bonded to each other, the sealing member 110 overlaps with at least a part of the outermost sub-pixels. The first substrate 10 and the second substrate 20 are bonded when the OLED 318 is formed. The sealing member 110 may overlap with at least a part of the outermost sub-pixels when the organic light emitting layer 318b is formed.

Figure 4:
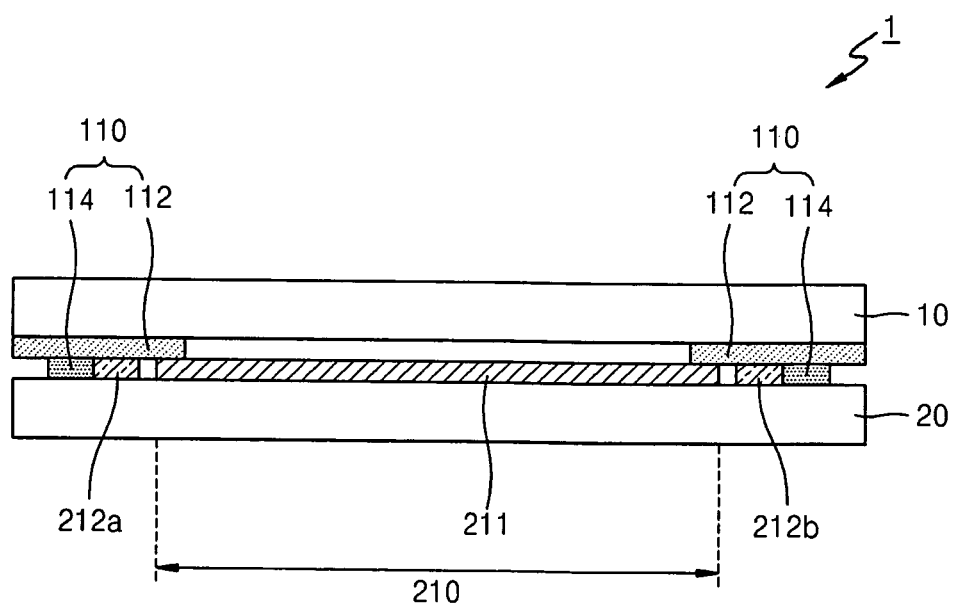
FIG. 4 illustrates a cross-sectional view of a flat panel display apparatus according to an embodiment.

FIG. 4 is a cross-sectional view of the flat panel display apparatus 1 according to an embodiment. Referring to FIG. 4, the flat panel display apparatus includes the sealing member 110 overlapping a part of a pixel unit 211. The pixel unit 211 is formed in the display region 210. As shown in FIG. 2, the sealing member 110 may overlap at least a part of the outermost sub-pixels. The sealing member 110 may include a first sealing member 112 and a second sealing member 114. The first sealing member 112 and the second sealing member 114 may be formed of the same type of material or different types of materials.

The pixel unit 211 and driving units 212a and 212b are formed on the second substrate 20. The first sealing member 112 covers the outermost edges of the pixel unit 211 and the driving units 212a and 212b. The second sealing member 114 performs cell sealing on outer sides of the driving units 212a and 212b. The first sealing member 112 widely extends to cover the outermost edges of the pixel unit 211 and the driving units 212a and 212b. The first sealing member 112, therefore, acts as a BM. The widely extending first sealing member 112 increases the cell sealing effect. The cell sealing increases mechanical rigidity of the flat panel display apparatus 1. The first sealing member 112 and the second sealing member 114 are stepped from each other, thereby securing a space for the pixel unit 211 and driving units 212a and 212b. Thus, the sealing member 110 covers a part of the pixel unit 211.

FIGS. 5A-5F are cross-sectional views of stages of a method of manufacturing the flat panel display apparatus, according to an embodiment.

Figure 5A:
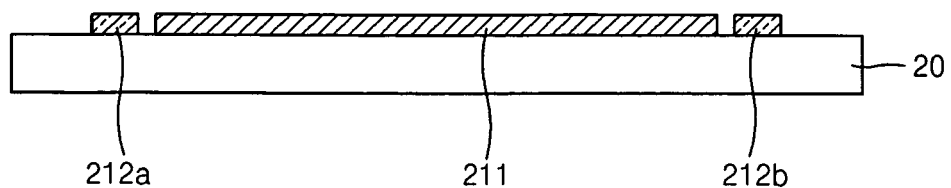
FIGS. 5A through 5F illustrate cross-sectional views of stages in a method of manufacturing a flat panel display apparatus, according to an embodiment.

Referring to FIG. 5A, the pixel unit 211 is formed on the display region 210 of the second substrate 20. The driving units 212a and 212b are formed on the display region 210 of the second substrate 20. As shown in FIG. 2, the pixel unit 211 may be disposed. The driving units 212a and 212b may include a gate driving circuit, a data driving circuit, etc. The driving units 212a and 212b may be formed on the second substrate 20 in a chip-on-glass (COG) manner. If the driving units 212a and 212b are formed by adhering an integrated circuit package to the second substrate 20 in a taping manner, the driving units 212a and 212b may be not disposed between the first substrate 10 and the second substrate 20. The driving units 212a and 212b may be disposed around the display region 210. The pixel unit 211 is formed in the display region 210. A pad (not shown) used to exchange data with a main device may be further formed on the second substrate 20.

Figure 5B:
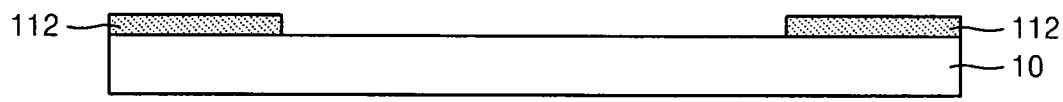
Figure 5C:
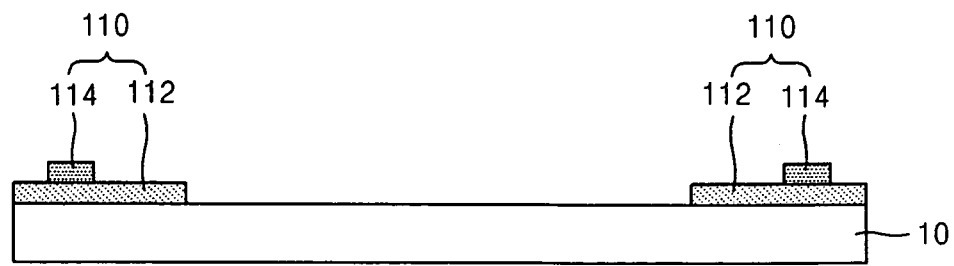

Referring to FIGS. 5B-5C, the sealing member 110 is formed on the first substrate 10. When the first substrate 10 and the second substrate 20 are bonded to each other, the first sealing member 112 overlaps with at least a part of outermost sub-pixels of the pixel unit 211 and the driving units 212a and 212b. The first sealing member 112 acts as a BM. The BM prevents light from emitting in a non-display region. The BM also reduces the visibility of the outermost sub-pixels of the pixel unit 211. The first sealing member 112 may entirely cover the non-display region. Referring to FIG. 5C, if the first sealing member 112 is formed, the second sealing member 114 is formed on the first sealing member 112. When the first substrate 10 and the second substrate 20 are bonded to each other, the second sealing member 114 may be disposed on the outer sides of the driving units 212a and 212b to perform cell sealing.

During the formation of the first sealing member 112 and the second sealing member 114, drying and sintering processes are performed. The drying and sintering processes are performed after preparing a material used to form the first sealing member 112 and the second sealing member 114, e.g., a frit. These processes are performed at high temperatures.

If the first sealing member 112 and the second sealing member 114 are to be formed of the frit, a frit paste is coated on the first substrate 10. Then, the frit paste is baked to remove moisture or an organic binder, and hardened. Thus, the frit paste is a gel formed by adding oxide powders and organic materials to glass powders. A frit baking temperature may be in the range of 300° C. and 500° C.

Although the first sealing member 112 and the second sealing member 114 are formed by two steps in FIGS. 5B-5C, the first sealing member 112 and the second sealing member 114 may be integrally formed. When the first sealing member 112 and the second sealing member 114 are integrally formed, the integrally formed first and second sealing members 112 and 114 may have steps so that the sealing member 110 covers at least a part of the outermost sub-pixels of the pixel unit 211 and the driving units 212a and 212b. The integrally formed first and second sealing members 112 and 114 are disposed on the outer sides of the driving units 212a and 212b.

Figure 5D:
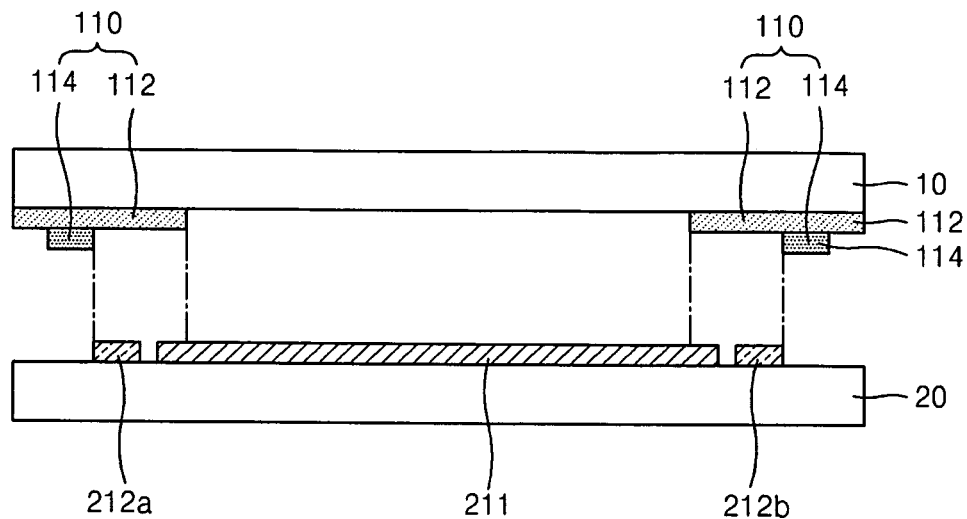

Referring to FIG. 5D, the first substrate 10 is inverted and is disposed on the second substrate 20. The first substrate 10 is bonded to the second substrate 20 after adjusting the position of the first substrate 10. Thus, the first sealing member 112 overlaps at least a part of the outermost sub-pixels of the pixel unit 211 and is disposed on the outer sides of the driving units 212a and 212b. Although the second sealing member 114 is disposed to contact the driving units 212a and 212b in FIGS. 4, 5D, and 5F, the second sealing member 114 and the driving units 212a and 212 may not contact each other. The second sealing member 114 and the driving units 212a and 212 may have a gap therebetween.

Figure 5E:
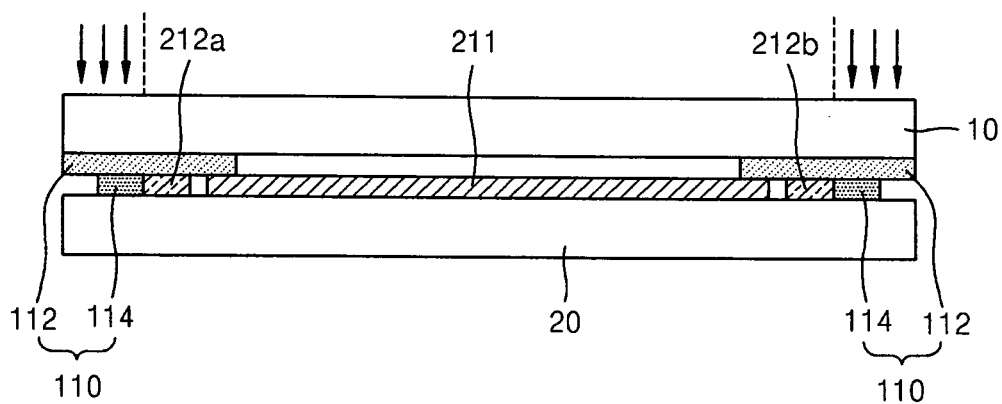
Figure 5F:
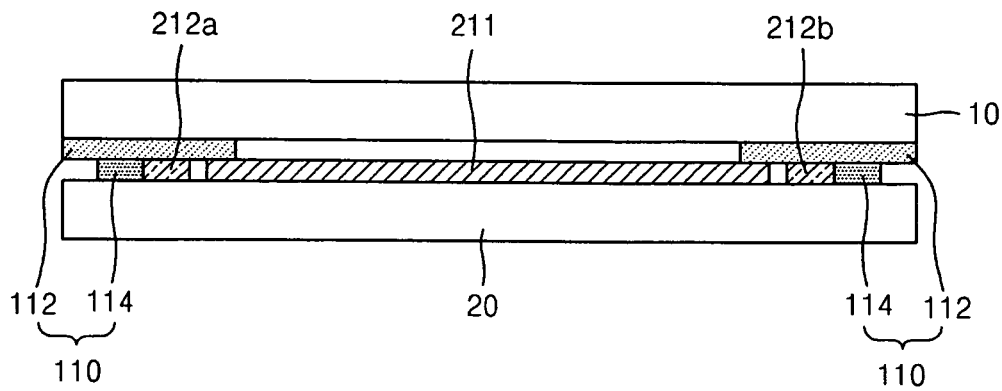

Referring to FIG. 5E, the second sealing member 114 is melted by irradiating a laser beam or infrared light onto a region of the first and second substrates 10 and 20. The second sealing member 114 is melted when the second sealing member 114 is disposed to bond the first and second substrates 10 and 20 to each other. The laser beam or infrared light may have a wavelength between about 800 nm and about 1200 nm. Thus, the laser beam or infrared light may be controlled to irradiate only the outer sides of the driving units 212a and 212b. The first sealing member 112 overlaps with the driving units 212a and 212b, and prevents the laser beam or infrared light from being irradiated onto the driving units 212a and 212b. Thus, when the laser beam or infrared light is irradiated, the first sealing member 112 may act as a mask and may prevent the laser or infrared ray from damaging the driving units 212a and 212b. As shown in FIG. 5F, if the first sealing member 112 and the second sealing member 114 are hardened after the laser beam or infrared light is irradiated, the flat panel display apparatus 1 is realized.

To melt and harden the first sealing member 112 and the second sealing member 114, joule heating may be used instead of a laser beam or infrared light. Thus, a predetermined wiring is disposed to contact the first sealing member 112 and the second sealing member 114. Power is supplied to both ends of the wiring, so the first sealing member 112 and the second sealing member 114 are melted and hardened.

By way of summation and review, according to one or more embodiments, a difference in visibility between outermost pixels and inner pixels of a flat panel display apparatus is reduced. Thus, visibility is increased of the flat panel display apparatus.

According to one or more embodiments, a sealing effect of a flat panel display apparatus is increased. Thus, the flat panel display apparatus has an increased mechanical rigidity.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. A flat panel display apparatus, comprising:
a first substrate;
a second substrate opposite the first substrate, the second substrate including a display region in which a plurality of pixels are formed; and
a sealing member between the first substrate and the second substrate, the sealing member bonding the first substrate and the second substrate to each other,
wherein the sealing member partially overlaps and directly contacts outermost pixels of the display region.

2. The flat panel display apparatus as claimed in claim 1, wherein:
the second substrate includes at least one driving unit that supplies a plurality of driving signals to the plurality of pixels,
wherein the sealing member overlaps at least one driving unit.

3. The flat panel display apparatus as claimed in claim 2, wherein the sealing member further comprises:
a first sealing member formed on the first substrate and partially overlapping and directly contacting the outermost pixels of the display region; and
a second sealing member disposed between the first substrate and the second substrate and formed on outer sides of the at least one driving unit.

4. The flat panel display apparatus as claimed in claim 1, wherein the plurality of pixels includes organic light emitting diodes (OLEDs).

5. The flat panel display apparatus as claimed in claim 4, wherein the sealing member partially overlaps a light emitting layer of the OLEDs of outermost pixels of the display region.

6. The flat panel display apparatus as claimed in claim 1, wherein an area where the sealing member partially overlaps the outermost pixels of the display region is determined such that visibility of the outermost pixels of the display region is the same as that of inner pixels of the display region.

7. The flat panel display apparatus as claimed in claim 1, wherein the sealing member surrounds outer sides of the display region.

8. The flat panel display apparatus as claimed in claim 1, wherein the sealing member is a frit.

9. A method of manufacturing a flat panel display apparatus that includes a first substrate, a second substrate opposite the first substrate, and a display region in which a plurality of pixels are formed, the method comprising:

forming a sealing member on the first substrate, the sealing member being located on the first substrate to partially overlap outermost pixels of the display region when the first substrate is disposed on the second substrate;

disposing the first substrate on the second substrate such that the sealing member partially overlaps and directly contacts the outermost pixels of the display region; and bonding the first substrate to the second substrate by using the sealing member.

10. The method as claimed in claim 9, wherein:

the second substrate includes at least one driving unit that supplies a plurality of driving signals to the plurality of pixels, wherein forming the sealing member includes locating the sealing member on the first substrate such that the sealing member overlaps the at least one driving unit when the first substrate is disposed on the second substrate.

11. The method as claimed in claim 10, wherein forming the sealing member includes:

forming a first sealing member on the first substrate to partially overlap with outermost pixels of the display region when the first substrate is disposed on the second substrate; and forming a second sealing member on the first sealing member and to be disposed on outer sides of the at least one driving unit when the first substrate is disposed on the second substrate.

12. The method as claimed in claim 10, wherein bonding the first substrate to the second substrate includes melting and hardening the sealing member by irradiating a laser beam or infrared light onto at least a part of outer sides of the at least one driving unit.

13. The method as claimed in claim 9, wherein the plurality of pixels include organic light emitting diodes (OLEDs).

14. The method as claimed in claim 13, wherein forming the sealing member includes locating the sealing member on the first substrate such that the sealing member partially overlaps a light emitting layer of the OLEDs of the outermost pixels of the display region when the first substrate is disposed on the second substrate.

15. The method as claimed in claim 9, wherein an area where the sealing member and the outermost pixels of the display region partially overlap is determined such that visibility of the outermost pixels of the display region is the same as that of inner pixels of the display region.

16. The method as claimed in claim 9, wherein forming the sealing member includes forming the sealing member to surround outer sides of the display region.

17. The method as claimed in claim 9, wherein bonding the first substrate to the second substrate includes melting and hardening the sealing member by irradiating a laser beam or infrared light onto at least a region of the sealing member.

18. The method as claimed in claim 9, wherein the sealing member is a frit.

* * * * *